United States Patent [19]

Barnert et al.

[11] 4,354,635

[45] Oct. 19, 1982

[54] FLUIDIZED BED REACTOR WITH OPEN REACTION GAS INPUT AND METHOD OF INCREASING THE DUCT

[75] Inventors: Eike Barnert, Jülich; Wolfgang Frommelt, Linnich; Erich Zimmer, Jülich, all of Fed. Rep. of Germany

[73] Assignee: Kernforschungsanlage Jülich GmbH, Jülich, Fed. Rep. of Germany

[21] Appl. No.: 178,785

[22] Filed: Aug. 18, 1980

Related U.S. Application Data

[62] Division of Ser. No. 85,780, Oct. 17, 1979, Pat. No. 4,259,925.

[30] Foreign Application Priority Data

Oct. 24, 1978 [DE] Fed. Rep. of Germany ....... 2846160

[51] Int. Cl.³ .............................................. B05B 17/24
[52] U.S. Cl. ......................................... 239/11; 427/6; 427/213; 118/303; 118/716; 138/39; 239/590.3
[58] Field of Search ..................... 427/6, 213; 138/39; 118/303, 716; 239/590.3, 11

[56] References Cited

U.S. PATENT DOCUMENTS 4,153,004  5/1979  Barnert ................................ 118/716

*Primary Examiner*—Sam Silverberg
*Attorney, Agent, or Firm*—Frishauf, Holtz, Goodman & Woodward

[57] ABSTRACT

The reaction gas throughout of the supply duct feeding gas to the bottom of a fluidized bed reactor of the kind shown in U.S. Pat. No. 4,153,004, issued May 8, 1979, is increased by providing the reaction gas supply tube in the form of a bundle of tubes of small cross-section of about 2 mm diameter. Subdivision of the supply tube into hexagonal ducts in honeycomb arrangement maximizes the useful cross-sectional area of the supply tube. With the smaller elemental tube diameters, a higher rate of flow is maintainable without loss of laminar flow behavior, which behavior is maintained in the jet issuing from the subdivided reaction gas supply duct as it flows towards the constricted entrance into the fluidized bed container while being surrounded by a sheath of inert carrier gas supplied by an annular duct surrounding the reaction gas tube. It is thus possible to increase the input of reaction gas without increasing the diameter of the jet or loss of the laminar flow characteristics necessary to prevent the reaction gas from making deposits that would interfere with the introduction of gas into the bottom of the bed.

1 Claim, 5 Drawing Figures

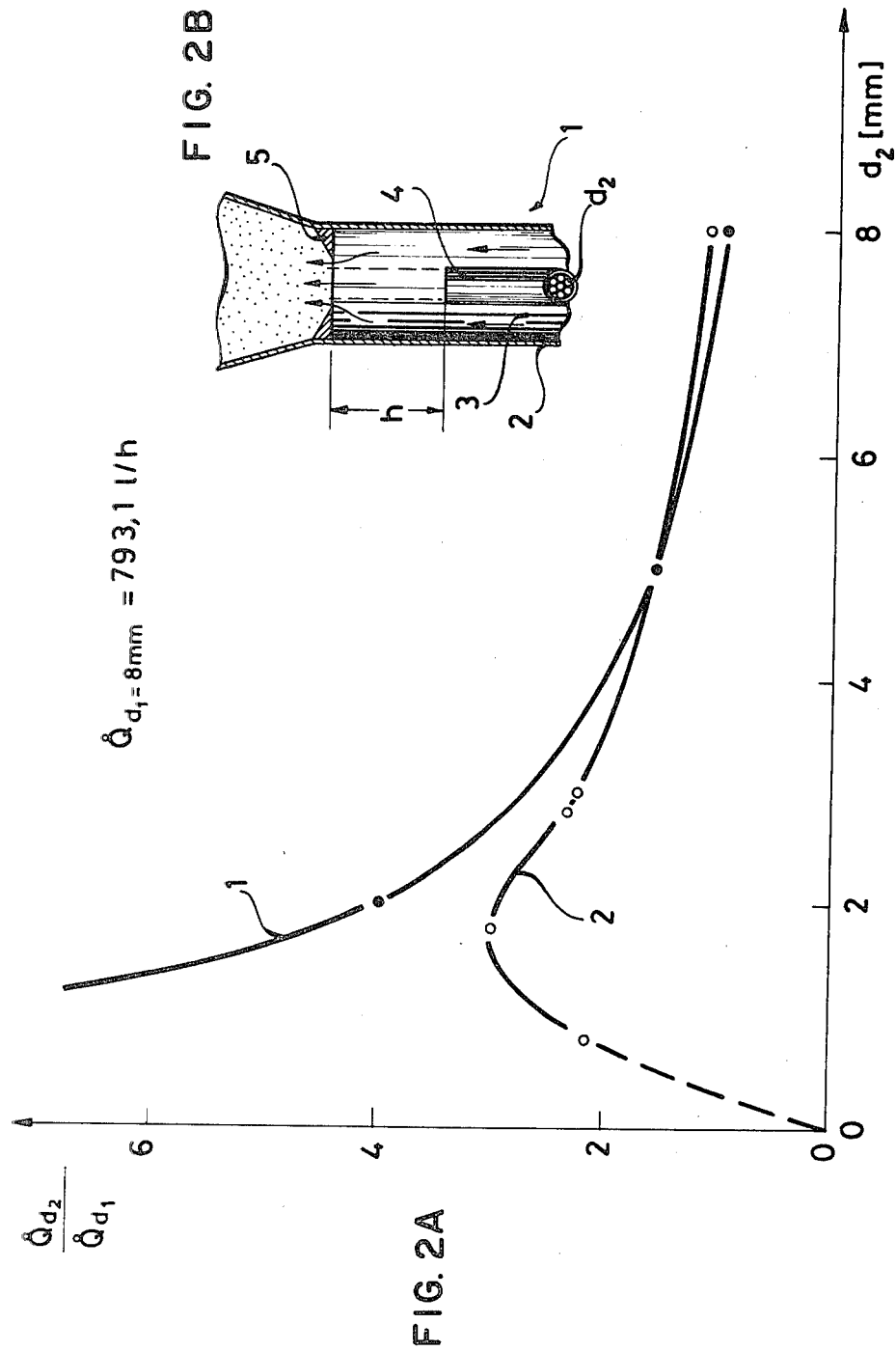

FLUIDIZED BED REACTOR WITH OPEN REACTION GAS INPUT AND METHOD OF INCREASING THE DUCT

This is a division of application Ser. No. 85,780 filed Oct. 17, 1979 U.S. Pat. No. 4,259,925.

The invention relates to fluidized bed reactor of the kind in which the reaction gas is fed through a central tube around which a carrier gas is fed through a concentric annular channel, the outer walls of the annular channel being continued beyond the end of the central tube and leading to a constriction through which the reaction gas, sheathed by carrier gas enters into the conical bottom portion of a fluidized bed reactor, as disclosed in U.S. Pat. No. 4,153,004, issued May 8, 1979, owned by the Assignee of the present invention, and in particular the invention concerns a method and means for increasing the throughput of fluids, particularly gases, while maintaining laminar flow conditions, especially at rates of flow approaching the limits for laminar flow.

The fluidized bed reactor described in the abovementioned U.S. patent was developed particularly for the coating of nuclear fuel with pyrolytic carbon, hereinafter abbreviated PyC. A particular problem of such fluidized bed reactors consists in the danger that PyC growths may form at the place where the reaction gas enters into the fluidized bed, causing stoppage of the input orifices. In accordance with the disclosure of that patent, this effect is reduced by providing a reaction gas supply apparatus in which the reaction gas is introduced into the fluidized bed as a laminar central jet issuing from a supply tube that terminates below the bottom of the fluidized bed and enters into the fluidized bed without contact with the walls of the apparatus by virtue of an annular flow of carrier gas surrounding the reaction gas.

A requisite for trouble-free operation of such a fluidized bed operation is, therefore, laminar behavior of the reaction gas flow, by which it is intended to prevent the gas, prior to contact with the material to be coated, should be in contact with portions of the reactor of which the temperature is at least equal to the decomposition temperature of the reaction gas, thus leading to PyC growth on these portions of the apparatus.

Certain limits are imposed on the use of fluidized bed reactors according to U.S. Pat. No. 4,153,004 for coating operations on a technical scale, because when larger quantities of nuclear fuel are to be coated, an increase of the reaction gas supply is required which cannot readily be provided. Thus, either for a given supply tube the flow rate must be increased, or else the discharge cross-section of the supply tube must be increased. The flow through a tube cannot be increased indefinitely, because at higher throughput values at which the critical Reynolds number is reached, the character of flow changes from laminar into turbulent. With increasing cross-section of the supply tube, on the other hand, the risk of entraining solid particles into the gas supply region is increased, because with increasing discharge orifice cross-section of the supply tube, the input orifice into the fluidized bed (at the constriction mentioned above) must also be enlarged.

SUMMARY OF THE INVENTION

It has been discovered by the present invention that an extension of the operating range of fluidized bed reactors of the kind above mentioned is possible if the cross-section of the reaction gas supply tube, at least in the neighborhood of its orifice, is subdivided. It goes practically without saying that the length over which the tube cross-section is subdivided must at the very least be sufficient so that if occasional turbulence is present in the flow before reaching the subdivided section, the flow coming out of the supply tube will nevertheless be laminar.

Accordingly, it is a feature of the fluidized bed reactor of the invention that the reaction gas supply tube has cross-sectional subdivision and, in particular, it is constituted by a bundle of tubes.

In this manner, the gas throughput for a given cross-section of the supply tube can be raised in the limit region for laminar flow without the occurrence of turbulence.

If there is considered the single tube having the cross-sectional area $F_1$ and a diameter $d_1$, in comparison to a bundle of tubes having an aggregate open cross-sectional area $F_2$ that is equal to the surface $F_1$, and it is composed of z surface elements $f_2$, each having the diameter $d_2$, the following equations result for the fluid (gas) throughput for the single tube and for the tube bundle, these throughputs being respectively designated $\dot{Q}_1$ and $\dot{Q}_2$:

$$d_1 \cdot \dot{Q}_1 = Re_1 \cdot d_1^2 \cdot \frac{\pi}{4} \cdot \frac{\eta 1}{\rho 1} \quad (1)$$

$\rho$ = fluid density $\eta$ = fluid viscosity $\pi = 3.1415\ldots$ $$d_2 \cdot \dot{Q}_2 = Re_2 \, z \, d_2^2 \cdot \frac{\pi}{4} \cdot \frac{\eta 2}{\rho 2} \quad (2)$$

$\rho$ = fluid density $\eta$ = fluid viscosity $\pi = 3.1415\ldots$

For the samd fluid in both cases and for a flow condition determined by equal Reynolds numbers ($Re_1 = Re_2$), for the two cases, it then follows that:

$$\frac{\dot{Q}_2}{\dot{Q}_1} = \frac{d_2}{d_1} \cdot z \quad (3)$$

Since $d_2 \cdot z$ is always greater than $d_1$, for the same state of flow in the two tube arrangements, and for the same open cross-section thereof, the throughput in the tube bundle is always greater than that in the single tube. That means that the throughput for the same flow increases with decreasing $d_2$.

This fact can be quite generally utilized in cases where it is desired to obtain the highest possible throughput with laminar flow of a fluid—regardless of the necessary power consumption. That means that cross-section subdivision, according to the invention, can always be of interest if by given constant flow behavior, particularly laminar flow in the limiting range for laminar flow, the greatest possible flow velocities are to be obtained or for a given conduit cross-section the greatest possible amounts of fluid are to be put-through per unit of time.

As an example, the transport of super-saturated liquids could be mentioned, where there is a tendency for a precipitate or bubbles to form, both of which are favored by turbulence.

In the equations set forth above, the geometric diameter tubes of circular cross-section are used for reasons of simplification, but it has been found that the relations thereby expressed nevertheless hold quite generally for any cross-sectional shape if the hydraulic or effective diameter for the cross-sectional area is substituted for the geometric diameter in the equations. For practical application of the invention, a hexagonal cross-section of the individual tubes of the tube bundle would appear to be particularly suitable, with a honeycomb arrangement of the individual tubes.

It is recognized that subdivision of the cross-section in pipes through which fluids flow are known as so-called rectifiers or grids inserts. These usually serve, however, for equalizing velocity profiles and are built into conduits for fluids without particular regard to the amount of throughput in the particular case, or to any particular state of flow (which can be basically turbulent or also laminar).

A particular object of the invention, as already mentioned above, is to obtain an increase of the reaction gas throughput in fluidized bed reactors of the type described above in which the reaction gas supply is provided through an open-ended type.

In this case, an increase of the flow through the conduit can be forced with maintenance of the required laminar flow behavior by subdivision of the cross-section for a given discharge cross-section that is small enough for the jet cross-section to remain small enough to prevent entrainment of the fluidized bed particles in the region where the gas is introduced. What is essential is that the free central jet coming out of the open end of the reaction gas supply tube, at some spacing below the fluidized bed floor, maintains all the way to its entrance into the fluidized bed, the laminar flow behavior that is imparted to it by cross-section subdivision in the supply tube. It has been found that the path length h, over which the laminar behavior is maintained after leaving the end of the supply tube, depends upon the subdivision cross-section.

BRIEF DESCRIPTION OF THE DRAWINGS

The invention is further described by way of illustrative example, with reference to the annexed drawings, in which:

FIG. 2A is a graph illustrating in curve 1 the theoretical throughput according to equation (3) and, in curve 2, the experimentally determined throughput of the central jet of reaction gas as a function of subdivision tube diameter for constant aggregate open cross-section, and FIG. 2B is a cross-sectional view of the bottom of a fluidized bed reactor with a reaction gas feed according to the invention for indicating the dimensions involved in FIG. 2A.

Figure 1A:
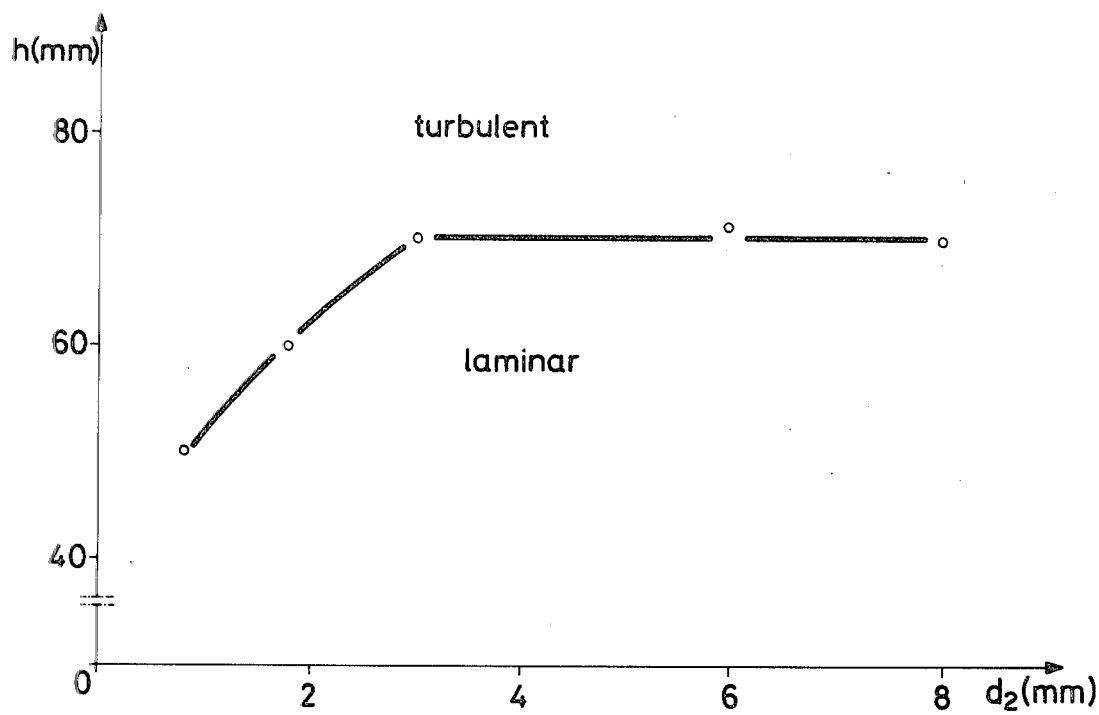
FIG. 1A is a graph showing the relation between the path length h and the subdivision tube cross-section represented by the corresponding diameter $d_2$.
Figure 1B:
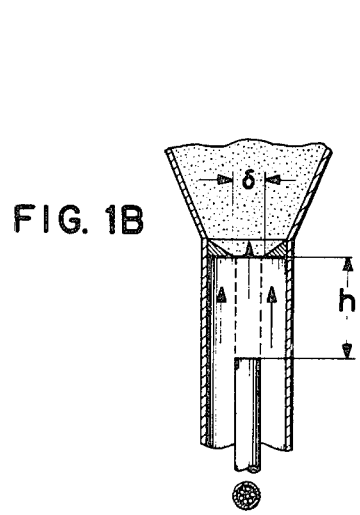
FIG. 1B is a cross-sectional view of the bottom of a fluidized bed reactor having a reaction gas feed according to the invention, illustrating the dimensions referred to in the description of FIG. 1A.
Figure 1C:
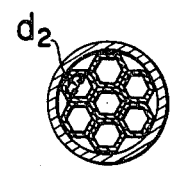

The experimentally determined curves shown in FIGS. 1 and 2 were developed under the following conditions:

Fluidized bed charge volume $V_B = 250$ ml of particles
Particle diameter $d_p = 300$ to $425$ $\mu$m
Particle density $\rho_p = 1.5$ g/cm$^3$
Reynolds number of the annular jet $Re_{Ring} \neq 1500$
Diameter of the input orifice $\delta = 8$ mm
Path length $h = 50$ mm (for FIG. 2, Curve 2), and
Fluid = air FIG. 1 shows the values of the maximum path length h over which laminar flow was experimentally found, plotted against the diameter of the subdivision tubes. As can be seen from this graph, h increases at small values of subdivision pipe diameter with increasing diameter, up to about $d = 3$ mm and then remains practically constant for $d > 3$ mm.

FIG. 2 shows the quotient of the limiting value (for laminar flow) of the throughputs respectively for the subdivided type and for the single-tube type (respectively $\dot{Q}_{d2}$ and $\dot{Q}_{d1}$) plotted against the subdivision tube diameter $d_2$. The single tube diameter of 8 mm giving a throughput of 793.1 liters of air per hour was used as a reference.

As can be seen, curve 1 (representing equation (3) and curve 2 (experimentally determined) are approximately the same in the region of relatively little subdivision. While curve 1 runs to infinity with diminishing diameter $d_2$, curve 2 runs through a maximum that lies at about $d_2 = 2$ mm.

With further cross-section subdivision, the limiting throughput falls again. The maximum of the curve determined in practice depends upon the jet length h. For $h > 50$ mm, the maximum value is smaller and for $h < 50$ mm, it is greater.

Under the conditions illustrated in the drawings, subdivision tube diameters suitable in practice lie in the neighborhood of 2 mm. The lower limit region for the subdivision tube diameter is imposed in practice by expense of manufacture exceeding economic justification and by the requirement that the usable cross-section should have an economic ratio to the aggregate cross-section.

In order to make it possible to fit the gas-feed nozzle of the fluidized bed reactor to various operating conditions, a reaction gas supply tube shiftable in the axial direction is of advantage.

Such an gas-feed nozzle 1, as known from the above-mentioned U.S. patent, except for the cross-section subdivision, is illustrated in FIG. 2. As shown, the outer wall 2 of the gas supply has an annular channel 3 for the carrier gas and a central tube 4 for the supply of the reaction gas. As shown diagrammatically at the bottom of FIG. 2B, the central tube 4 is subdivided into a bundle of small tubes having each the diameter $d_2$. The reaction gas and the carrier gas are introduced through the constriction 5 provided in the bottom of the fluidized bed container, into the pyrolysis furnace constituted by that container because of the heat applied to it by means not shown.

The reaction gas supply tube 4 preferably has its cross-section subdivided over its whole length, but in the case of very long connections to the reaction gas reservoir or generator, the subdivided end portion terminating in the pipe 2, as shown in FIG. 2B, need not go all the way back to the reservoir or generator if it is long enough to smooth out all turbulence that might be present occasionally at its input end.

The minimum length of the subdivided portion is given by the formula $$l_{min} = 0.03 \, Re \cdot d_2$$

An axially shiftable reaction gas supply tube is illustrated in the above-mentioned U.S. Pat. No. 4,153,004.

Although the invention has been described with reference to particular illustrative examples, it will be understood that modifications and variations are possible within the inventive concept. Even in structures closely similar to those illustrated, for example, the hydraulic diameter of the individual channels of the subdivided reaction gas supply tube, instead of being 2 mm, may quite suitably be anywhere between about 1 mm and about 3.5 mm, and preferably between 1.5 mm and 3.5 mm, as is evident from FIG. 2A.

We claim:

1. A method of achieving an increased rate of laminar gas flow in the limiting range for laminar gas flow in a straight terminal portion of an open-ended duct and the length of the laminar portion of a jet issuing therefrom, which consists of providing said terminal portion of said duct with subdividing walls for subdividing the interior thereof into a plurality of separate ducts of substantially equal cross sectional area over a straight terminal portion of said duct having a length (l) which is not less than 3% of the product ($Re \cdot d_2$) obtained by multiplying the diameter of one of the separate ducts ($d_2$) by the Reynolds number (Re) of the gas flow therein.

* * * * *